United States Patent
King et al.

(10) Patent No.: US 7,123,728 B2
(45) Date of Patent: Oct. 17, 2006

(54) SPEAKER EQUALIZATION TOOL

(75) Inventors: Nick King, San Jose, CA (US);
Michael F. Culbert, Monte Sereno, CA (US)

(73) Assignee: Apple Computer, Inc., Cupertino, CA (US)

( * ) Notice: Subject to any disclaimer, the term of this patent is extended or adjusted under 35 U.S.C. 154(b) by 584 days.

(21) Appl. No.: 09/929,935

(22) Filed: Aug. 15, 2001

(65) Prior Publication Data

US 2003/0035555 A1     Feb. 20, 2003

(51) Int. Cl.
*H03G 5/00*     (2006.01)
(52) U.S. Cl. ............... 381/98; 715/716; 700/94; 708/323
(58) Field of Classification Search .......... 381/98–103, 381/109, 104, 57, 113; 715/716; 700/94
See application file for complete search history.

(56) References Cited

U.S. PATENT DOCUMENTS

| | | | | |
|---|---|---|---|---|
| 4,939,782 | A * | 7/1990 | Gambacurta | 381/103 |
| 5,212,733 | A * | 5/1993 | DeVitt | 381/119 |
| 5,617,480 | A * | 4/1997 | Ballard et al. | 381/98 |
| 6,359,987 | B1 * | 3/2002 | Tran | 381/57 |
| 6,385,322 | B1 * | 5/2002 | Mietling | 381/82 |
| 6,804,565 | B1 * | 10/2004 | Eid | 700/94 |
| 6,999,826 | B1 * | 2/2006 | Zhou et al. | 700/94 |
| 2003/0009247 | A1 * | 1/2003 | Wiser et al. | 700/94 |

FOREIGN PATENT DOCUMENTS

| | | |
|---|---|---|
| EP | 1117179 A2 | 7/2001 |
| GB | 2266210 A | 10/1993 |
| GB | 2357409 A * | 6/2001 |
| GB | 2357409 A | 6/2001 |

OTHER PUBLICATIONS

Texas Instruments, TAS3001C Stereo Audio Digital Equalizer, Data Manual, SLAS226, Sep. 1999, pp. 1-1 through B-1.
Scott Lehman, Harmony Central, article entitled "Equalization", 1996, 8 pages.
Robert Bristow-Johnson, Crescent Engineering, Montclair, NJ, article entitled "The Equivalence of Various Methods of Computing Biquad Coefficients for Audio Parametric Equalizers", undated, 12 pages.
English Translation of Korean Notification of Provisional Rejection dated Mar. 9, 2006, 2 pages.

* cited by examiner

*Primary Examiner*—Daniel Swerdlow
(74) *Attorney, Agent, or Firm*—Beyer Weaver & Thomas, LLP

(57) ABSTRACT

A computer readable medium containing program instructions for controlling a parametric equalizer is provided. Generally, a computer readable code is provided for displaying a composite equalization curve, wherein the composite equalization curve is formed from at least a first frequency filter with a first center frequency, a second frequency filter with a second center frequency, and a third frequency filter with a third center frequency. A computer readable code is provided for allowing a dragging movement of the first center frequency, the second center frequency, and the third center frequency.

17 Claims, 12 Drawing Sheets

SPEAKER EQUALIZATION TOOL

FIELD OF THE INVENTION

The present invention relates generally to speaker equalization. More particularly, the present invention relates to tools for providing improved speaker equalization.

BACKGROUND OF THE INVENTION

In sound systems, an equalizer is used to boost or cut certain frequency components in a signal to provide a desired sound from the sound system. Such sound effects may be bringing out a particular instrument's sound or providing a more realistic sound. Two common types of equalizers for sound systems are graphic equalizers and parametric equalizers.

FIG. 1 is a schematic view of a graphic equalizer system 100. A graphic equalizer system 100 comprises a plurality of bandpass filters 120, 124, 128 connected in parallel. Each bandpass filter allows a component of a signal within a bandpass filter frequency range to pass through the bandpass filter. Each component is then amplified by amplifier 130 associated with the bandpass filter. The components are then added together by adders 132. Often a slider board is used to set the amplifiers associated to the bandpass filters. FIG. 2 is a schematic view of a slider board 200 for a graphic equalizer. The slider board 200 has a plurality of sliders 204, where each slider controls an amplifier 130. Often the sliders 204 may be placed in a curved configuration as shown in FIG. 2 to provide a curved equalization, where the middle frequencies are amplified more than the outer frequencies. The sliders 204 may be placed in other configurations to provide other equalizer configurations.

Parametric equalizers are equalizers which may provide more flexibility than a graphic equalizer. A single parametric equalizer allows not only the setting of boost or cut, but also the center frequency and the bandwidth. An example of a parametric equalizer is the TAS3001C Stereo Audio Digital Equalizer chip set by Texas Instruments™. The TAS3001C may provide six parametric equalizer filters. The filters may be placed serially. The parametric equation for each filter may be:

$$H(z) = \frac{b_0 + b_1 z^{-1} + b_2 z^{-2}}{1 + a_1 z^{-1} + a_2 z^{-2}}$$

Five coefficients $b_0$, $b_1$, $b_2$, $a_1$, and $a_2$ may be provided to the parametric equation to define the center frequency and bandwidth of the filter. The coefficients may be provided in a format providing 4 bits for an integer part of the coefficient and 20 bits for a fractional part of the coefficients. One method of providing center frequencies and bandwidths to the filters is by placing numbers in a spreadsheet. The coefficients would be derived from the numbers in the spreadsheet and sent to the filters. From the resulting sound, a new set of numbers may be submitted. Through trial and error, a preferred set of center frequencies and bandwidths may be found.

It would be desirable to provide an improved interface for an equalizer.

SUMMARY OF THE INVENTION

To achieve the foregoing and other objects and in accordance with the purpose of the present invention, a computer readable medium containing program instructions for controlling a parametric equalizer is provided. Generally, a computer readable code is provided for displaying a composite equalization curve, wherein the composite equalization curve is formed from at least a first frequency filter with a first center frequency, a second frequency filter with a second center frequency, and a third frequency filter with a third center frequency. A computer readable code is provided for allowing a dragging movement of the first center frequency, the second center frequency, and the third center frequency.

In another embodiment of the invention, a method of providing equalizer presets for a speaker type is provided. Generally, an equalization preset generated for a type of speaker is provided. A speaker of a first type is connected to a computer system. A preset for said first type of speaker is loaded into the computer system. The loaded preset is used as a default equalization for all applications executed by the computer system.

In another embodiment of the invention, a parametric equalization curve generation device is provided. A first filter control comprises a first center frequency object and a first type selector, which allows the selection of the first filter type. A second filter control comprises a second center frequency object, wherein a second center frequency may be changed by a dragging movement of the second center frequency object; and a second type selector, which allows the selection of the second filter type. A third filter control comprises a third center frequency object, wherein a third center frequency may be changed by a dragging movement of the third center frequency object and a third type selector, which allows the selection of the third filter type. A graphic display displays the first center frequency object, the second center frequency object, and the third center frequency object to facilitate dragging movement, and for displaying a composite curve. A parametric equalizer provides real time equalization changes resulting from the dragging movement.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well-known process steps and/or structures have not been described in detail in order to not unnecessarily obscure the present invention.

Figure 3A:
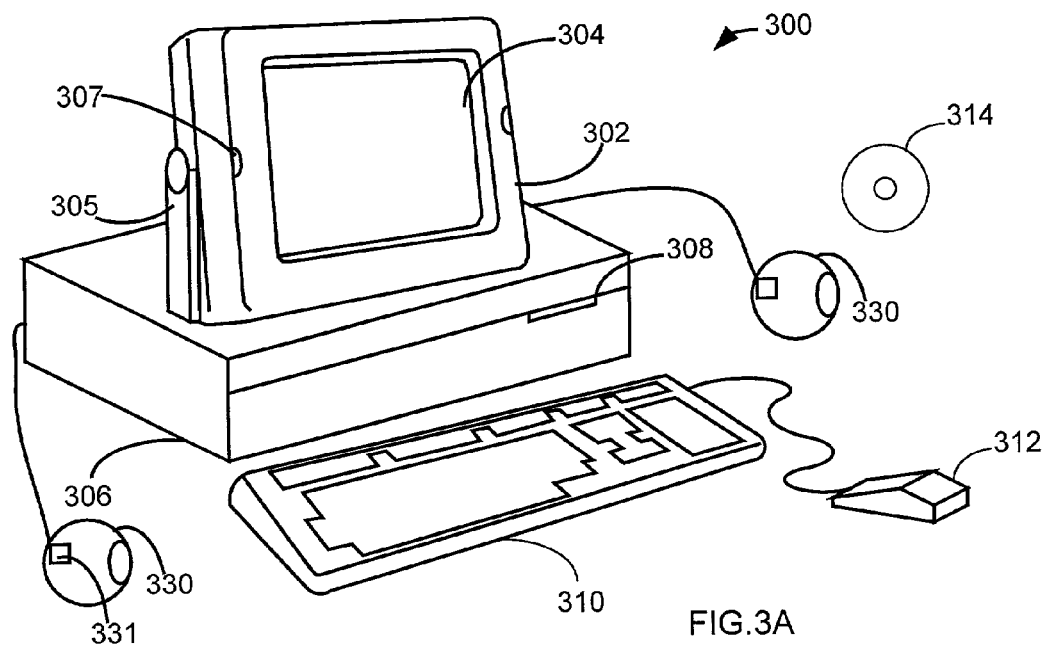
FIGS. 3A and 3B illustrate a computer system, which is suitable for implementing embodiments of the present invention.
Figure 3B:
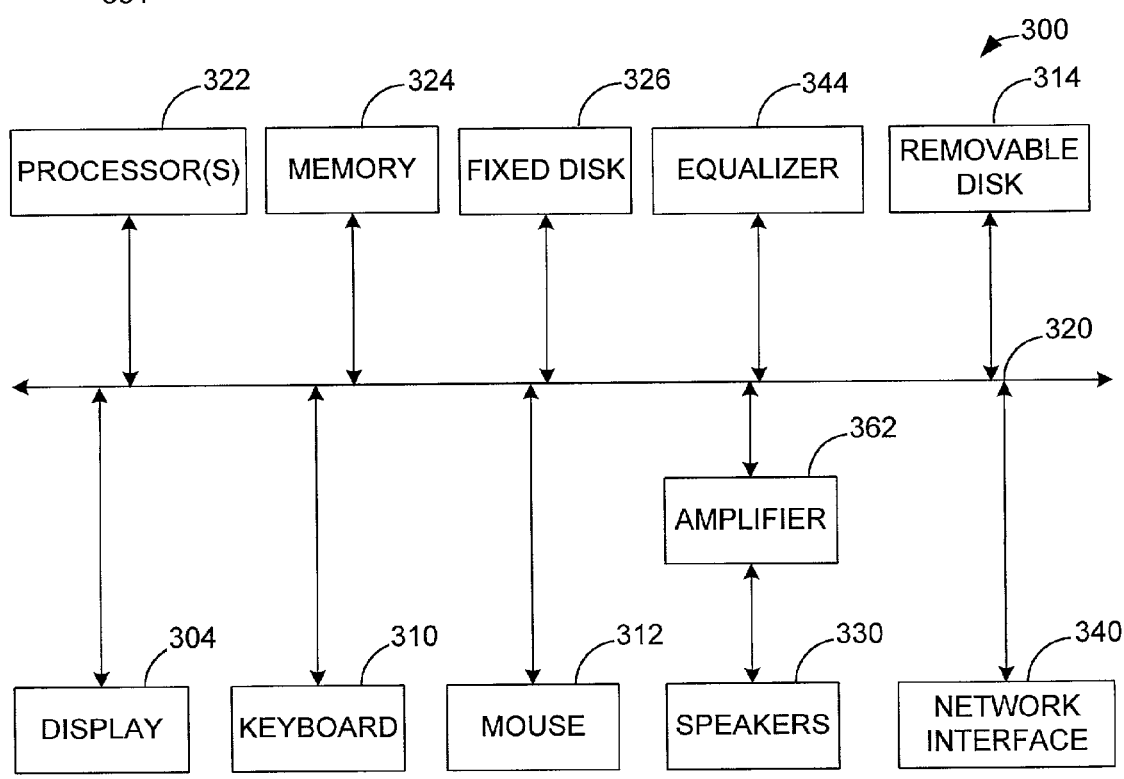

To facilitate discussion, FIGS. 3A and 3B illustrate a computer system 300, which is suitable for implementing embodiments of the present invention. FIG. 3A shows one possible physical form of the computer system 300 connected to a set of speakers 330. Of course, the computer system may have many physical forms ranging from an integrated circuit, a printed circuit board, and a small handheld device up to a huge super computer. Computer system 300 includes a monitor 302, a display 304, a housing 306, a disk drive 308, a key board 310, and a mouse 312. Disk 314 is a computer-readable medium used to transfer data to and from computer system 300.

FIG. 3B is an example of a block diagram for computer system 300. Attached to system bus 320 are a wide variety of subsystems. Processor(s) 322 (also referred to as central processing units, or CPUs) are coupled to storage devices including memory 324. Memory 324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 326 is also coupled bi-directionally to CPU 322; it provides additional data storage capacity and may also include any of the computer-readable media described below. Fixed disk 326 may be used to store programs, data, and the like and is typically a secondary storage medium (such as a hard disk) that is slower than a primary storage. It will be appreciated that the information retained within fixed disk 326 may, in appropriate cases, be incorporated in standard fashion as virtual memory in memory 324. Removable disk 314 may take the form of any of the computer-readable media described below.

CPU 322 is also coupled to a variety of input/output devices such as display 304, keyboard 310, mouse 312 and speakers 330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 322 optionally may be coupled to another computer or telecommunications network using network interface 340. With such a network interface, it is contemplated that the CPU might receive information from the network, or might output information to the network in the course of performing the above-described method steps. Furthermore, method embodiments of the present invention may execute solely upon CPU 322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and DVDs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter.

An equalizer 344 such as a TAS3001C Stereo Audio Digital Equalizer by Texas Instruments may be connected to the CPU 322. Speakers 330 are connected to an output amplifier 362. The output amplifier 362 may be connected to the equalizer 344 through the bus 320 or by other means such as a direct hardwire connection or through a device. The TAS3001C is a 32-bit processor that performs digital audio signal processing providing parametric equalization, bass, treble, volume control, and dynamic range compression, which may be used for speaker equalization and microphone equalization. Microphones 307 may also be provided, where the equalizer 344 is electrically connected to the microphones 307 through the bus 320 or by other means. The speakers 330 may have an identification device 331, such as an internal ROM that may allow the computer system to identify the speakers 330.

In another embodiment, the equalizer may be implemented entirely by software run on a host processor. In another embodiment, the equalizer may be a combination of hardware and software implemented on the host processor or other various implementations of a parametric equalizer.

Figure 4:
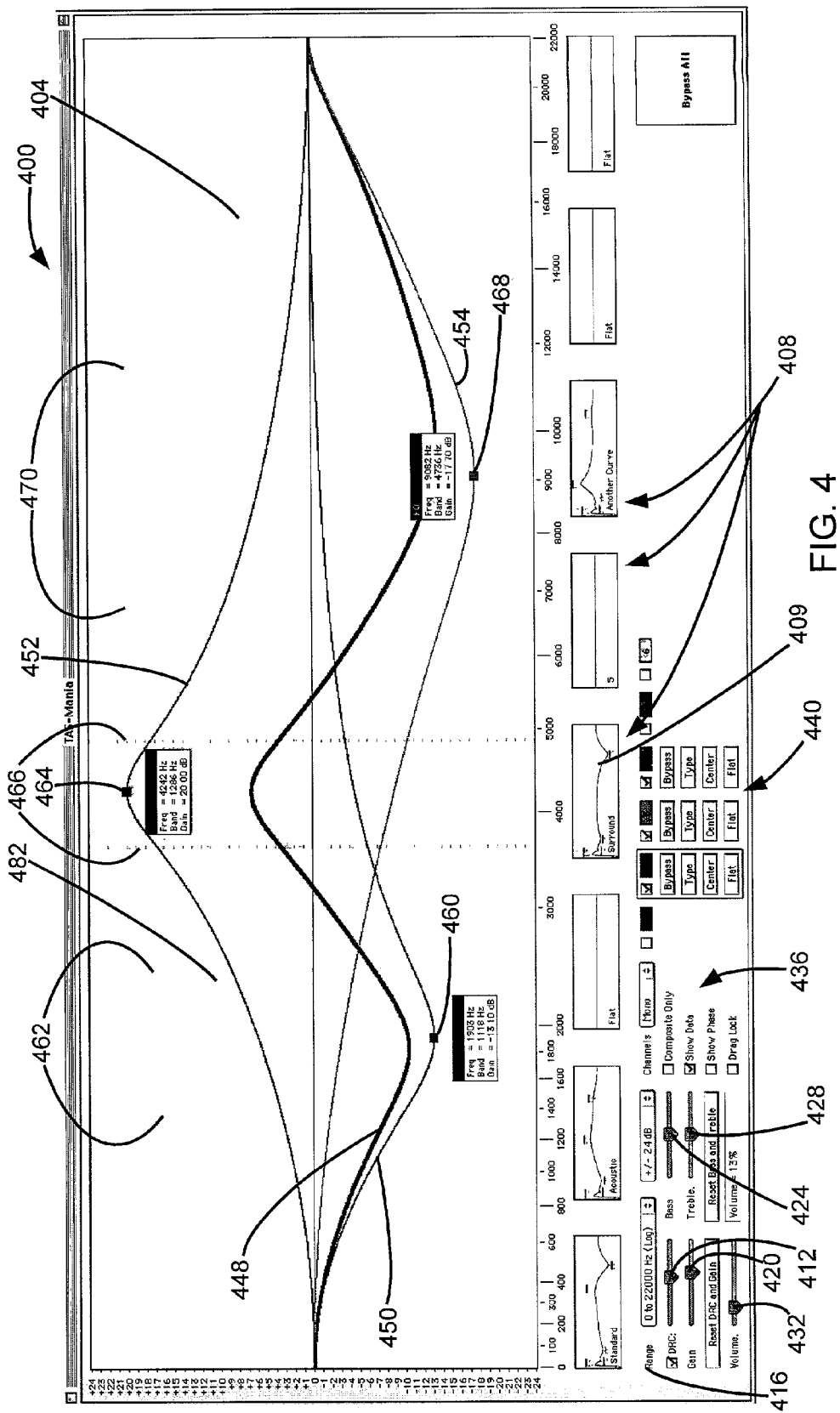
FIG. 4 is a screen shot of a graphic user interface (GUI), which is provided by a preferred embodiment of the invention.

To facilitate discussion, FIG. 4 is a screen shot of a graphic user interface (GUI) that is provided by a preferred embodiment of the invention. The GUI 400 comprises a current frequency versus amplitude graph 404, preset graphs 408 (with a surround preset graph 409), a dynamic range compression control 412, a dynamic range compression indicator 416, a gain control 420, a bass control 424, a treble control 428, a volume control 432, graph attribute controls 436, and filter attribute controls 440.

In FIG. 4, a composite curve 448, is the sum of a first filter curve 450, a second filter curve 452, and a third filter curve 454. The first filter curve 450 is an equalization curve with a center frequency of 1903 Hz, a bandwidth of 1118 Hz, and a gain of −13.10 dB. The second filter curve 452 is an equalization curve with a center frequency of 4242 Hz, a bandwidth of 1286 Hz and a gain of 20.00 dB. The third filter curve 454 is an equalization curve with a center frequency of 9082 Hz, a bandwidth of 4736 Hz, and a gain of −17.70 dB. The first filter curve 450 has a first center frequency object 460 and at least one first bandwidth adjusting object 462. The second filter curve 452 has a second center frequency object 464 and at least one second bandwidth adjusting object 466. The third filter curve 454 has a third center frequency object 468 and at least one third bandwidth adjusting object 470. The center frequency of the first filter curve 450 may be changed by a dragging movement of the first center frequency object 460 in a horizontal direction. The dragging movement of the first center frequency object provides a dragging movement of the first center frequency. The gain of the first filter curve 450 may be changed by a dragging movement of the first center frequency object 460 in a vertical direction, which is perpendicular to the horizontal direction. In the preferred embodiment, the dragging movement is done by selecting the first center frequency object with a mouse button and then moving the first center frequency object. Other ways of providing dragging movement may be by selection and movement using a touch pad, track ball or other device that allows the selection of the first center frequency object and then a preferably continuous movement of the first center frequency object. This dragging movement is different than making changes by typing in specific frequency numbers. In the preferred embodiment, during the dragging movement of the first center frequency object 460 the equalization is changed, so that a continuous change of equalization is produced during the continuous dragging movement of the first center frequency object 460. In the same way, the center frequency of the second filter curve 452 may be changed by a dragging movement of the second center frequency object 464 in a horizontal direction, and the center frequency of the third filter curve 454 may be changed by a dragging movement of the third center frequency object 468 in a horizontal direction. The gain of the second filter curve 452 may be changed by a dragging movement of the second center frequency object 464 in a vertical direction, which is perpendicular to the horizontal direction. The gain of the third filter curve 454 may be changed by a dragging movement of the third center frequency object 468 in a vertical direction, which is perpendicular to the horizontal direction. Therefore, the user interface allows a dragging movement of the first center frequency object, the second center frequency object, and the third center frequency object and a continuous real time change in equalization according to the dragging movement of the first center frequency object, the second center frequency object, and the third center frequency object.

The bandwidth of the first filter curve may be changed by a dragging movement of one of a pair of first bandwidth adjusting objects 462. The bandwidth of the second filter curve may be changed by a dragging movement of one of a pair of second bandwidth adjusting objects 466. The bandwidth of the third filter curve may by changed by a dragging movement of one of a pair of third bandwidth adjusting objects 470. As with the adjustment of center frequencies, as the bandwidth adjusting objects 462, 466, 470 are subjected to a continuous dragging movement, the equalizer provides a continuous adjusting. In the preferred embodiment of the invention, the pair of first bandwidth adjusting objects 462 are formed by a first vertical bar and a second vertical bar, as shown. The dragging movement of one of the vertical bars causes the movement of the other vertical bar of the pair, to either widen or narrow the bandwidth, indicated by shaded region 482. In other embodiments, the curves may have a single bandwidth adjusting object.

Instead of requiring a user to provide numbers and then to listen to the equalization as a result of the provided number and then to try to determine new numbers to provide, the preferred embodiment of the invention allows a user to provide a dragging movement to a center frequency object or a bandwidth adjustment object and real time equalization so the user can hear the change in equalization allowing the user to adjust equalization by ear, instead of trying to guess at numbers to enter. The composite curve allows the user to see an accurate equalization curve for the output amplifier connected to the speakers. This allows the user to adjust the equalization by ear and by sight.

Figure 1:
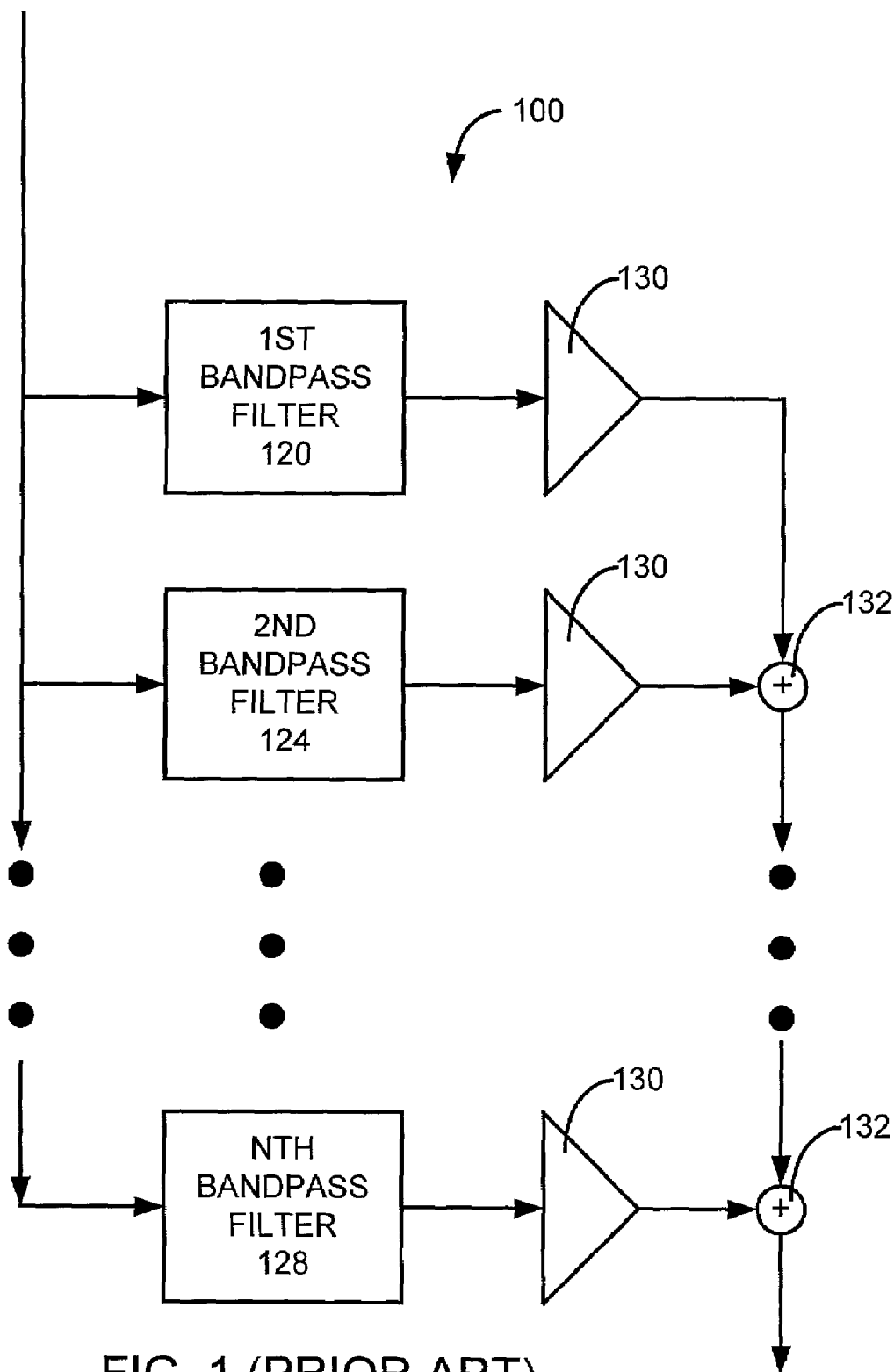
FIG. 1 is a schematic illustration of a graphic equalizer used in the prior art.
Figure 2:
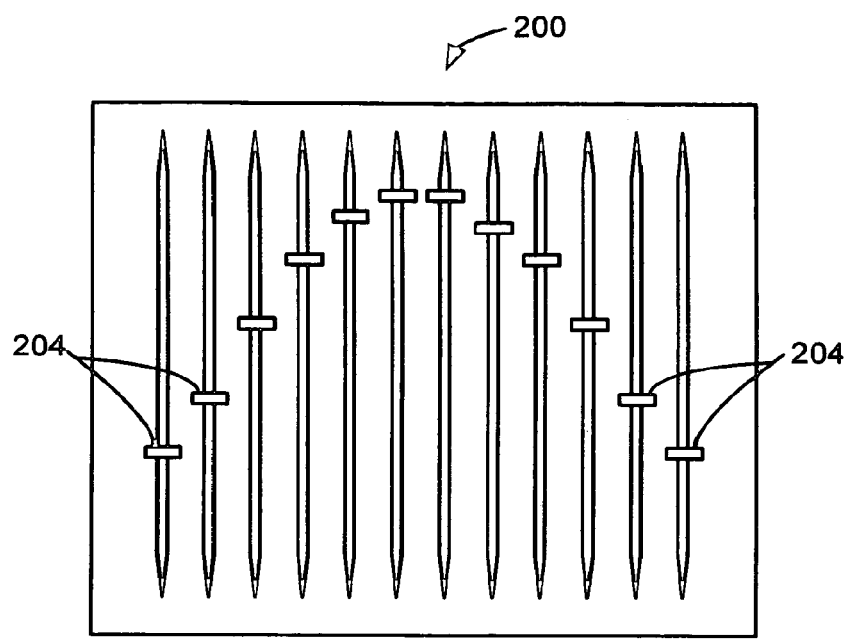
FIG. 2 is a schematic illustration of a slider board.
Figure 5:
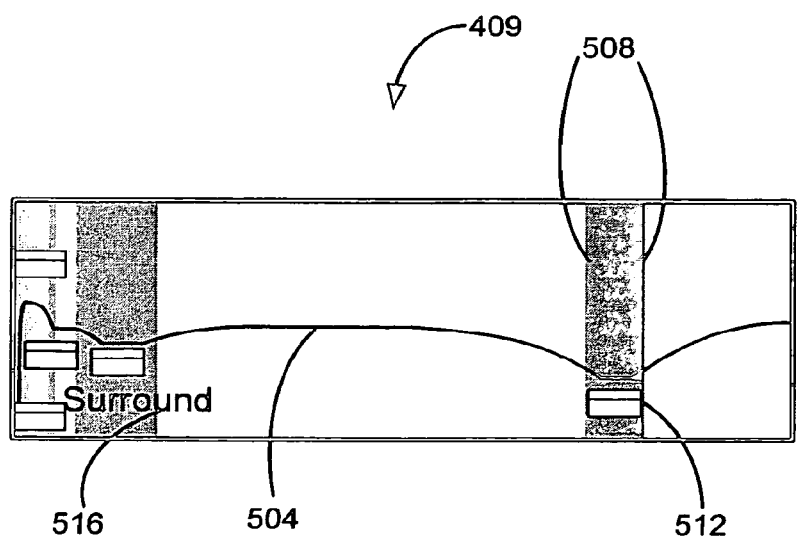
FIG. 5 is an enlarged view of the surround preset graph.
Figure 6:
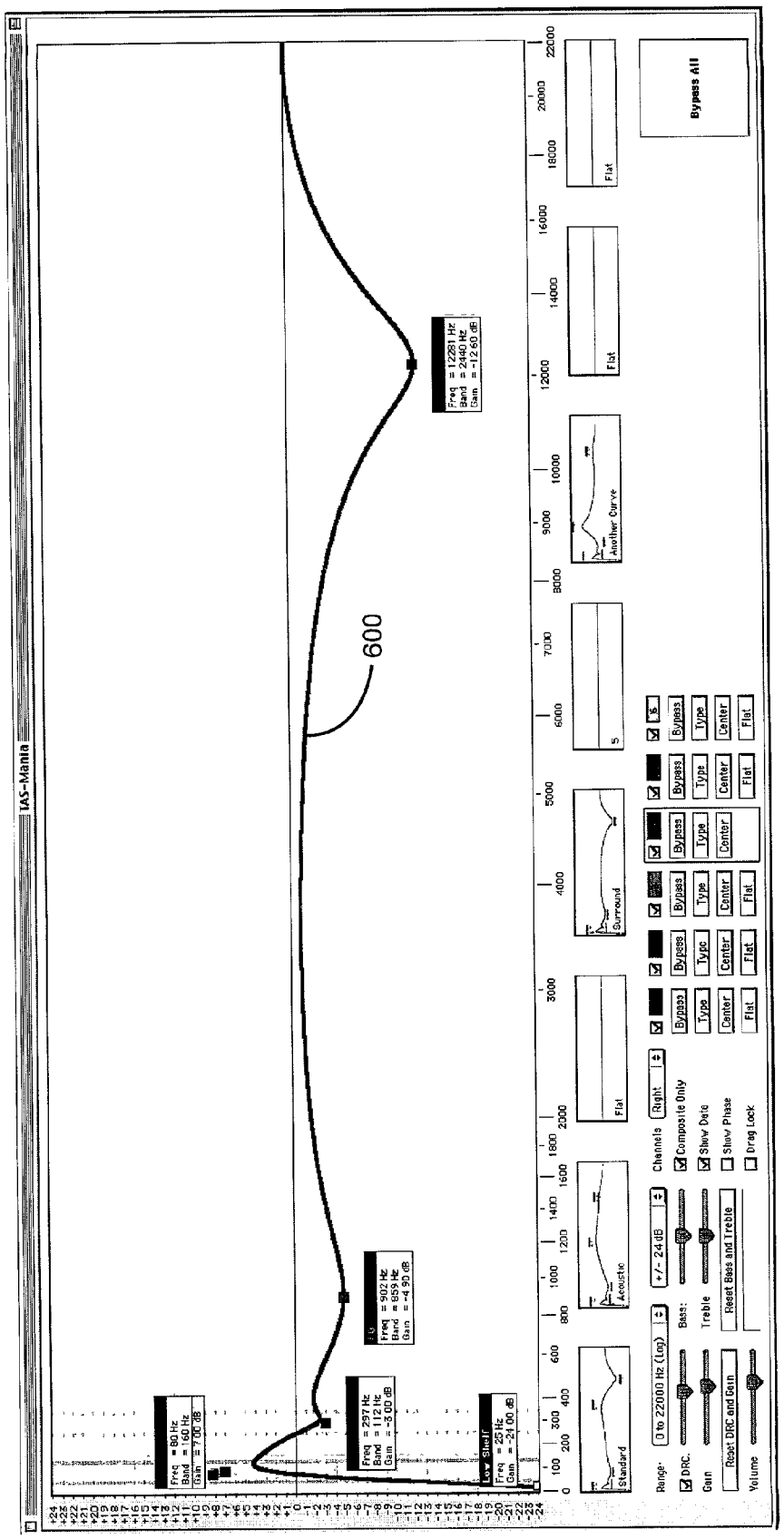
FIG. 6 is a GUI displaying a surround graph as the composite curve.
Figure 7:
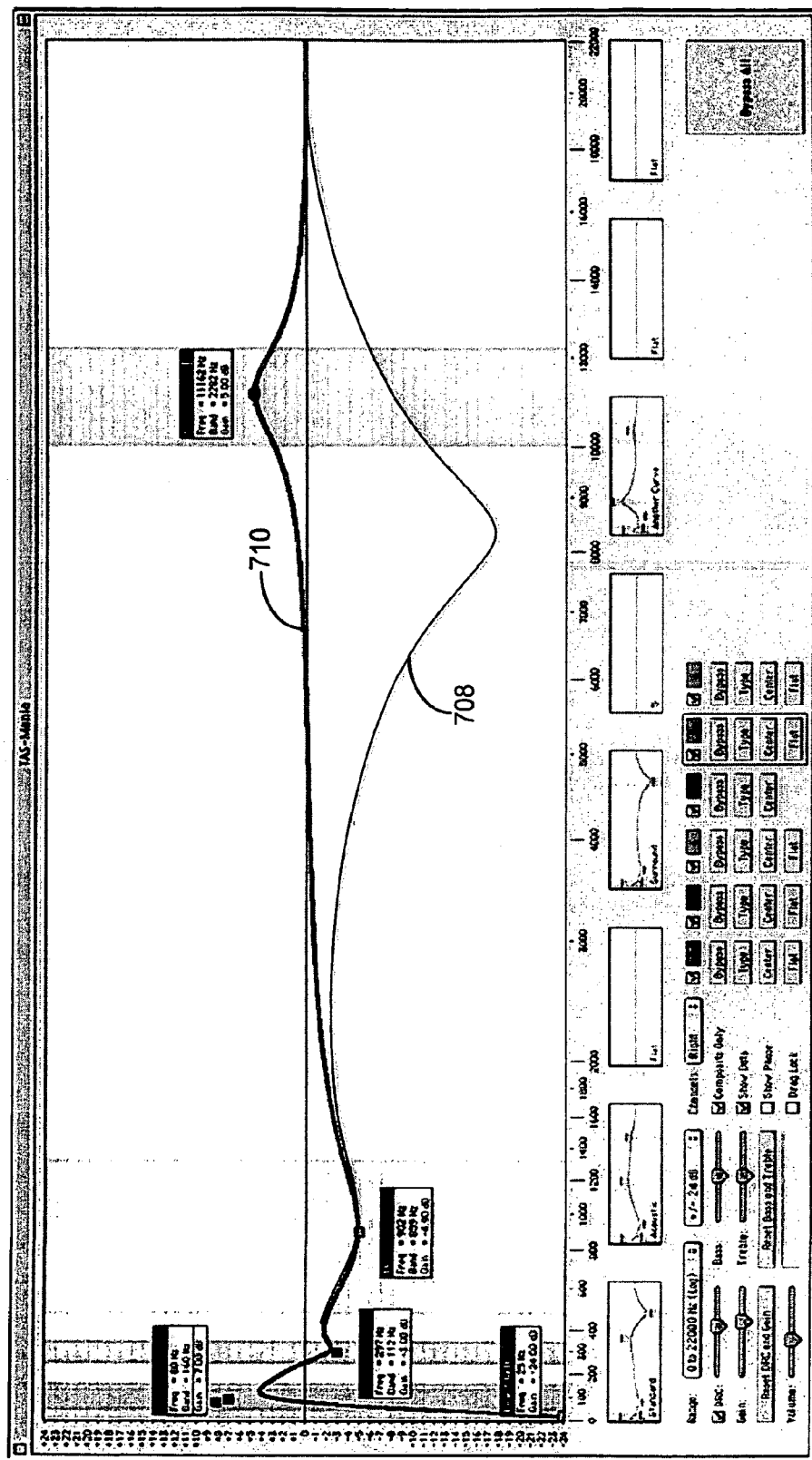
FIG. 7 is a screen shot of the surround graph that has been changed.

FIG. 5 is an enlarged view of the surround preset graph 409. The surround preset graph 409 comprises a composite curve graph 504, with filter bandwidth indicators 508, center frequency indicators 512, and a label 516. A user is able to save a composite curve to a preset graph and provide a label to identify the settings. One preferred embodiment allows a current composite graph to be saved as a preset by pushing a selection button, such as a "shift" button and then selecting and clicking on a preset graph. In another embodiment, an icon, such as a store button, may be provided, which when selected stores a current composite graph to a preset. When the surround preset graph is selected, which may be done by selecting the preset graph or by selecting a designated icon, such as a recall button, the GUI changes to display the surround graph 600, as shown in FIG. 6. FIG. 7 is a screen shot of the surround graph that has been changed. The original surround preset curve 708 is shown along with the new edited composite curve 710.

Providing a thumbnail graphical display of the presets allows a user to more easily select a preset, since the graphical display may more clearly allow a user to view the equalization provided by the preset. In other embodiments, the presets may be buttons without a graphical display, but with text or may be a button without a graphical display and without text.

Figure 8:
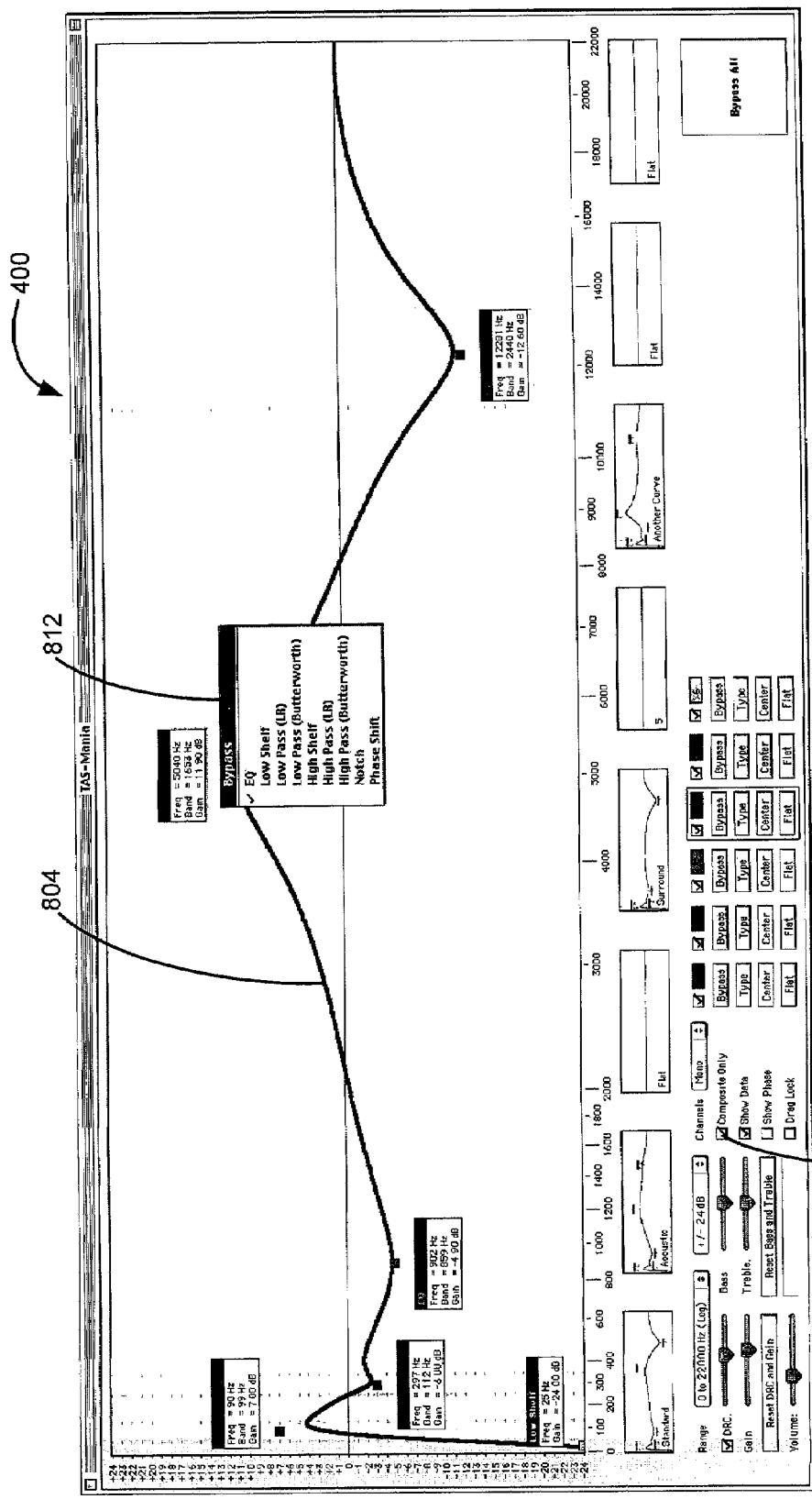
FIG. 8 is another screen shot of the graphic user interface with another composite curve.

FIG. 8 is another screen shot of the graphic user interface 400 with another composite curve 804. A "Composite Only" choice 808 of the graph attributes control 436 has been activated, so that the composite curve 804 is shown without showing the filter curves. The GUI 400 provides a pull down menu 812 that allows the user to designate a filter as a Gaussian equalization filter, a low shelf filter, a low pass (LR) filter, a low pass (Butterworth) filter, a high shelf filter, a high pass (LR) filter, a high pass (Butterworth) filter, a notch filter, or a phase shift filter. The first, second, and third filter curves 450, 452, 454 are examples of Gaussian equalization curves.

Figure 9:
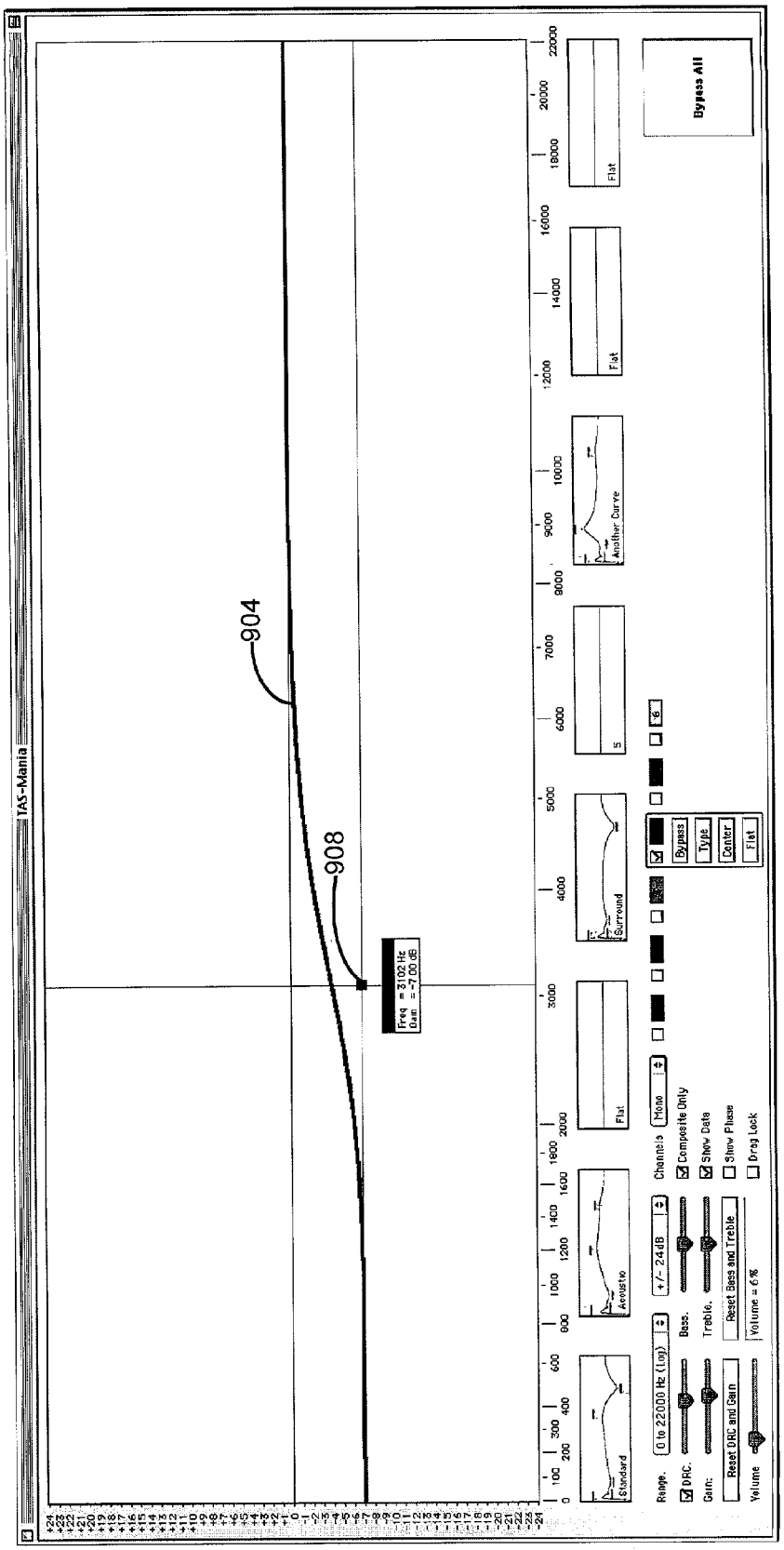
FIG. 9 is another screen shot of the graphic user interface with another composite curve.

FIG. 9 is another screen shot of the graphic user interface with another composite curve 904. The composite curve 904 is the sum of a single filter so that in this example, the composite curve 904 is identical to the single filter, which is a low shelf filter. The low shelf filter is defined by a center frequency, which in this example is 3102 Hz and the gain, which in this example is −7.00 dB. A center frequency object 908 allows for the setting of both the center frequency and the gain by a dragging movement. In the preferred embodiment, a vertical dragging movement of the center frequency object 908 allows the adjustment of the gain, and a horizontal dragging movement of the center frequency 908 object allows for adjustment of the center frequency. The low shelf filter provides no gain to frequencies a distance above the center frequency and provides the designated gain to all frequencies below a distance from the center frequency. Various definitions for a center frequency of a low shelf filter are known in the art. Generally, such center frequencies are a frequency within the transition region between the region where there is no gain and the region where there is a gain (positive or negative).

Figure 11:
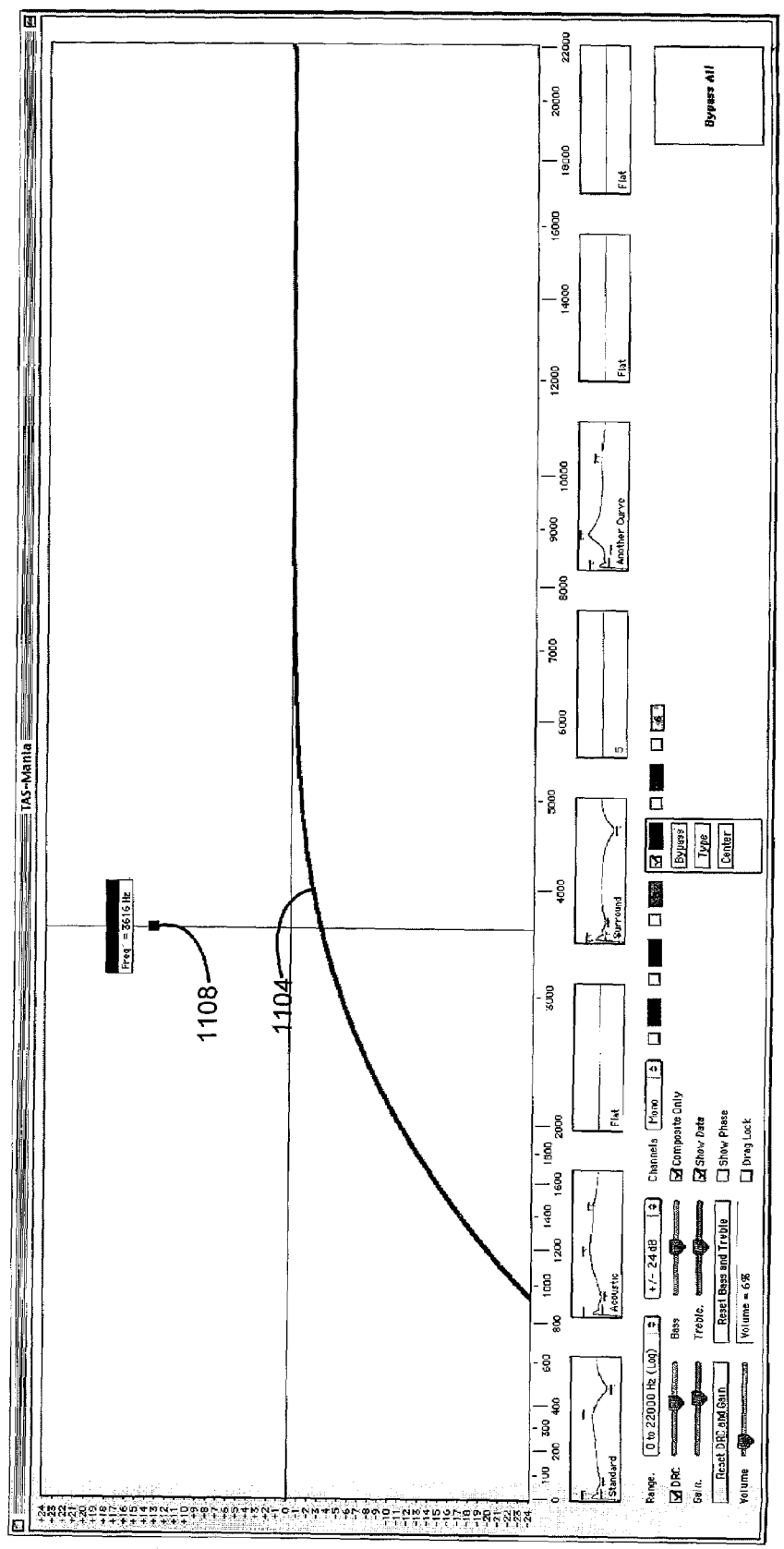
FIG. 11 is another screen shot of the graphic user interface with another composite curve.

FIG. 11 is another screen shot of the graphic user interface with another composite curve 1104. The composite curve 1104 is the sum of a single filter so that in this example, the composite curve 1104 is identical to the single filter, which is a high pass filter. The high pass filter is defined by a center frequency, which in this example is 3616 Hz. A center frequency object 1108 allows for the setting of the center frequency by a dragging movement. For a high pass filter the center frequency is a cut off frequency. The high pass filter provides no gain to frequencies a distance above the center frequency and blocks the signal for all frequencies below a distance from the center frequency. Various definitions for a center frequency of a high pass filter are known in the art. Generally, such center frequencies are a frequency within the transition region between the region where there is no gain and the region where the signal is blocked.

Definitions for a low pass (LR) filter, a low pass (Butterworth) filter, a high shelf filter, a high pass (LR) filter, a high pass (Butterworth) filter, a notch filter, or a phase shift filter are known in the art, with various definitions for center frequency being known in the art. Generally, such center frequencies would be provided to obtain parameters for a parametric equalizer. Various software programs are known that use center frequency, and, if relevant to the desired filter, gain, and bandwidth to generate the parameters used for the parametric equalizer. This allows the parametric equalizer to provide a large number of different types of filters, which may be used in and displayed by various embodiments of the invention.

Figure 12:
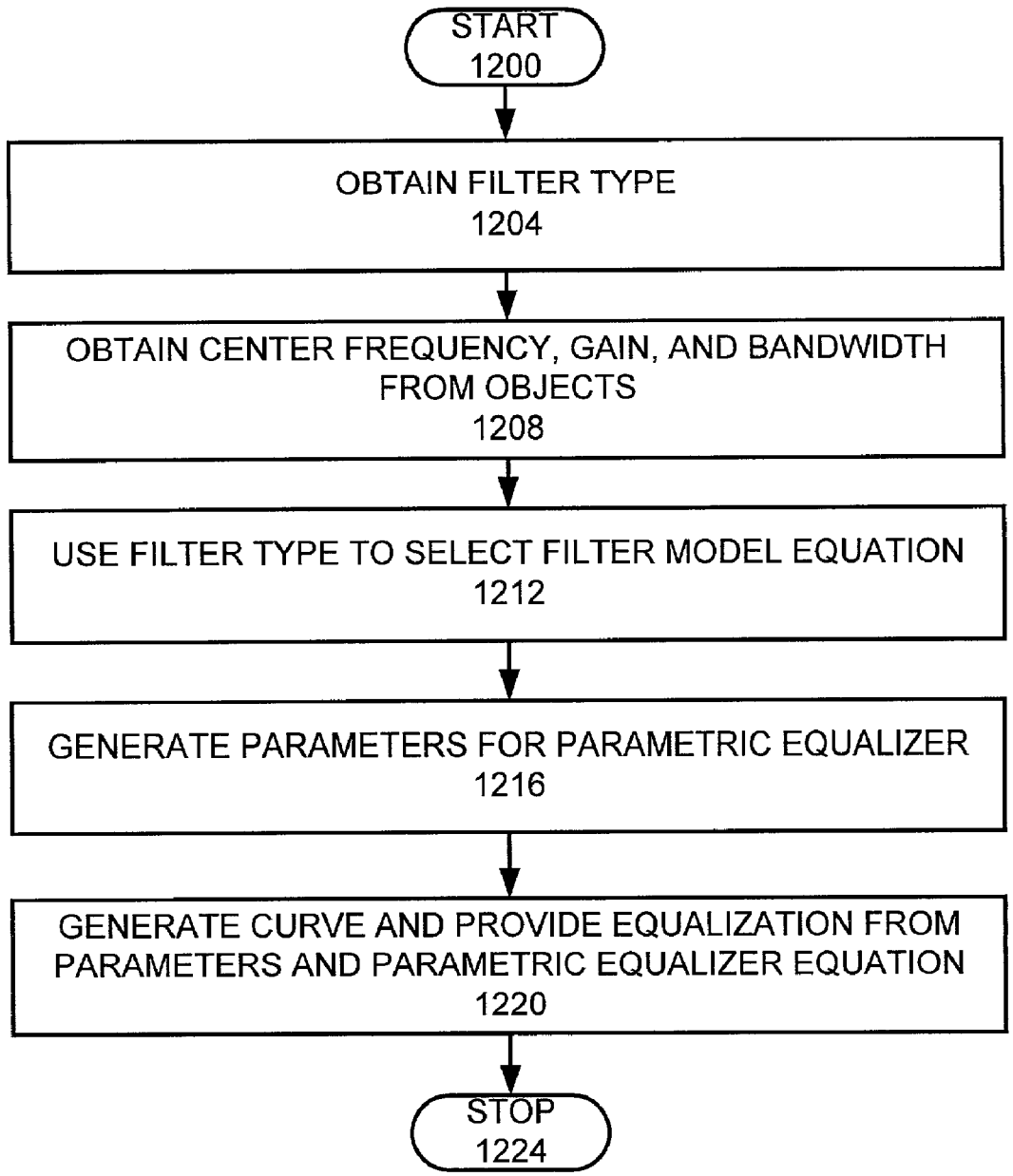
FIG. 12 is a flow chart for a process of generating a displayed curve for a filter.

FIG. 12 is a flow chart for a process of generating a displayed curve for a filter. A filter type is obtained (step 1204). The filter type is designated by the pull down menu 812 or by some other designation method. The center frequency, gain, and bandwidth are also obtained (step 1208). The center frequency and gain may be obtained from the location of a center frequency object, such as the first center frequency object 460, for the first filter curve 450. The bandwidth may be obtained from the location of a bandwidth adjusting tool, such as the first bandwidth adjusting tool 462. Some filter types do not have a bandwidth and/or gain. For filter curves for such filter types, bandwidth information and/or gain information is not obtained. Filter types may use the center frequency information for cut off frequencies, pass frequencies or notch frequencies. The filter type is used to obtain a filter model equation (step 1212). Frequency center, bandwidth, and gain information are plugged into the filter model equation to obtain parameters for the parametric equalizer (step 1216). The parameters and the parametric equalizer equation are used to generate a displayed curve for a filter and provide equalization in real time (step 1220). For an equalization curve, if the modeling is done correctly, the generated and displayed equalization curve should pass through the center frequency object.

Figure 10:
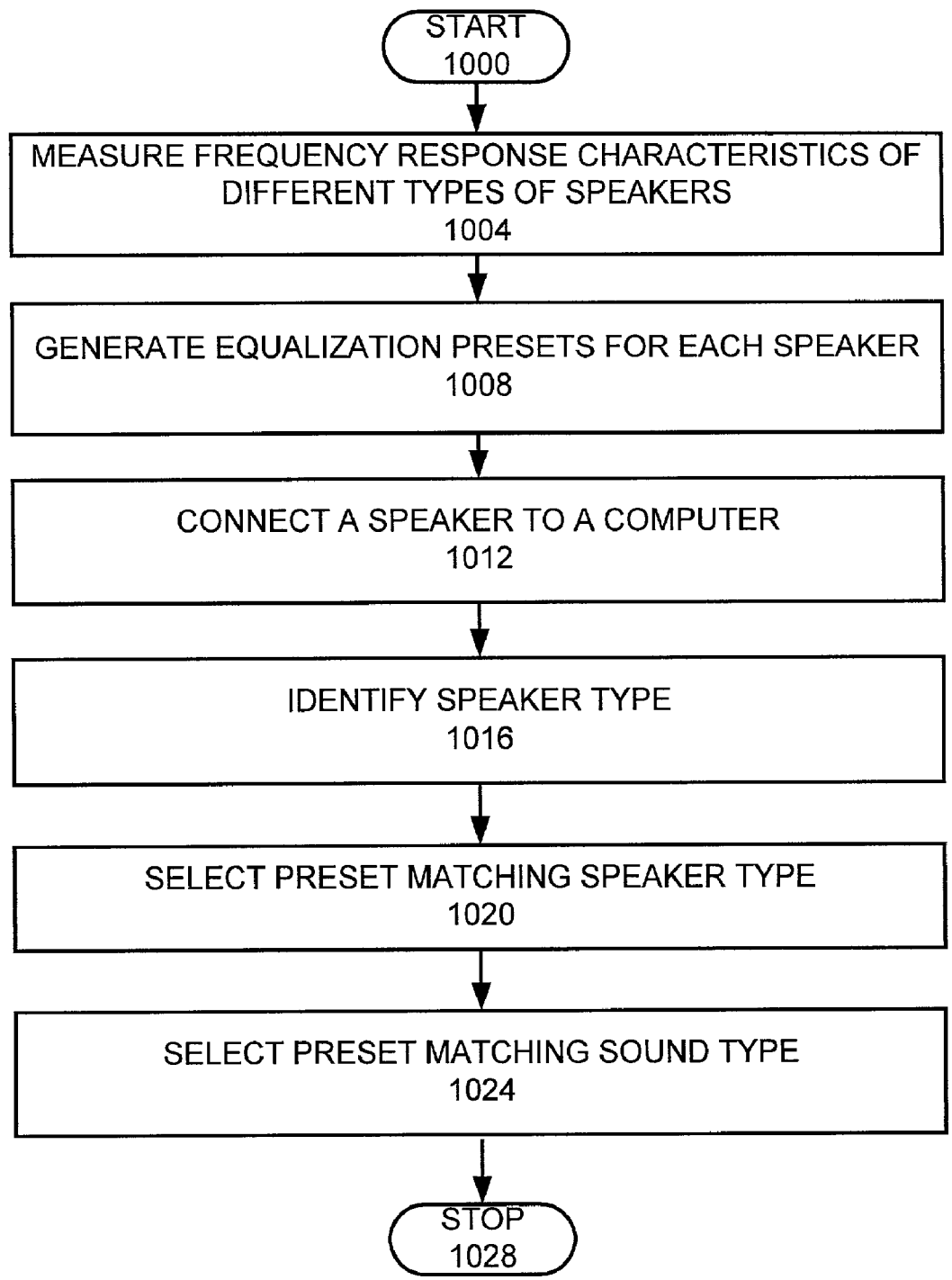
FIG. 10 is a flow chart of a method for providing a more accurate composite curve.
Figure 13:
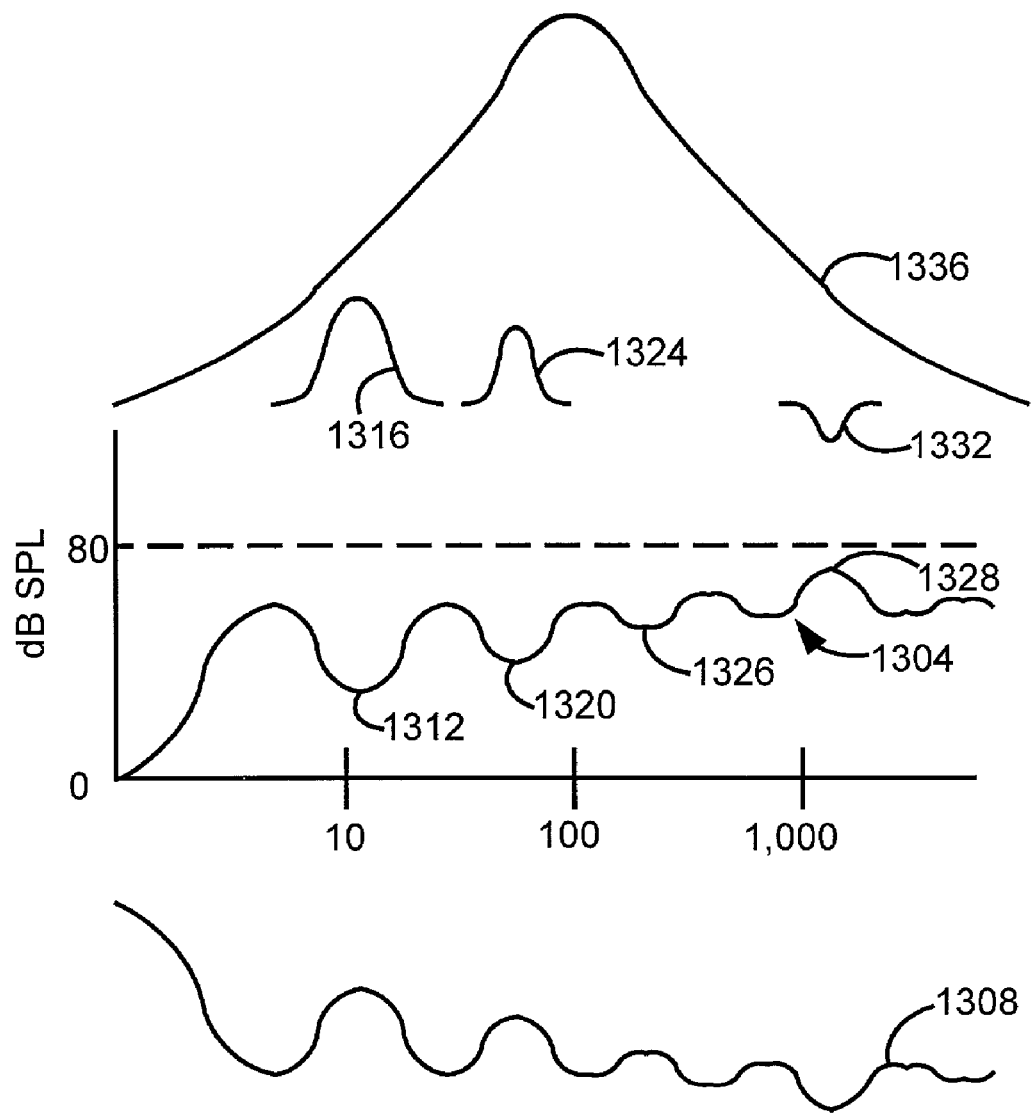
FIG. 13 illustrates a frequency response plot for a speaker.

Different types of speakers would have different frequency response characteristics. To provide an enhanced audio output, parametric equalization settings should be determined by the frequency response characteristics of the speakers. FIG. 10 is a flow chart of a method for setting a parametric equalizer according to the frequency response characteristics of the speakers. The frequency response characteristics of different types of speakers are first measured (1004). In the preferred embodiment, the speakers are connected to a computer and placed in an anechoic chamber. Different tones of different frequency are generated. A sensor is used to measure the volume of the speakers at different frequencies to provide a frequency vs. volume measurement (frequency response characteristic) for the speaker. FIG. 13 illustrates a frequency response plot 1304 for a speaker. The frequency response plot 1304 plots the decibel sound pressure level (dB SPL) output from the speaker against the frequency of the tone applied to the speaker.

The prior art may use a digitally generated inverse curve, with up to over 100 digital filters to try to generate an inverse curve 1308, which would provide a flat sound pressure output to frequency response. Such equalization, although perfectly correcting the sound pressure to frequency response, may not be pleasant to a human ear. Therefore, the invention provides a way for an expert to easily compensate the frequency response for a speaker to yield an output which is pleasant to a human ear. The invention allows the generation of equalization presets using parametric equalization filters (step 1008). An expert may determine that a first trough 1312 in the frequency response of the speaker is in an audibly important location, such as in the middle of the low mid-base vocals. The expert then could use the inventive GUI to provide a first frequency filter with a first frequency curve 1316, which compensates for the first trough 1312. Since this is best done by ear, the inventive GUI allows an expert to slowly change the center frequency, gain, and bandwidth while listening in real time to the changes. The expert may determine that a second trough 1320 is in the middle of frequencies for fricatives. Therefore, the expert may use a second frequency filter with a second frequency curve 1324, which compensates for the second trough 1320. The expert may determine that a third trough 1326 is shallow and in a frequency range that is not important and may decide to provide no equalization correction. The expert may determine that a first hump 1328 may cause the sound to seem to be too bright, so the expert may use a third frequency filter to provide a third frequency curve 1332. After the frequency response has been compensated, the expert may add a fourth frequency response curve 1336, so that the response is not flat. A composite graph is generated as the sum of the filters. As described above, the filter curve and composite graph are exact representations of the filters and composite result instead of being models. The filter settings are stored as a parametric equalization preset. A plurality of presets may be generated for each type of speaker to accommodate different types of sounds.

Speakers are connected to a computer (1012). The computer identifies the speaker type (step 1016). In the preferred embodiment, the computer uses the identification devices 331 in the speakers 330 to identify the speaker type. In other embodiments, a user may manually identify the speaker or the speaker may be identified by other means, such as a speaker driver. The presets are selected by a computer according to the speaker connected to the computer (step 1020). These presets may be part of an operating system, or may be part of the software that comes with speakers (such as a driver), or may be provided over the Internet or by some other means. The sound being equalized may have an indicator to identify what type of sound is being equalized. For example, some MP3 music files may have an identifier for the type of music, such as a classical music identifier. The computer may use such an identifier to select a preset that matches the speakers and the type of sound (step 1024).

The resulting equalization may be provided for any audio output from the computer. The equalization may be performed on output in real time, instead of processing a saved audio file to generate a new audio file to be saved that has to be equalized. Processing a saved audio file to generate a new audio file is a lossy process, where data may be lost during each process. Placing an audio file through a several equalization regenerations could degrade the audio file significantly.

The presets may be used in an operating system so that a default preset is provided for all sounds played by the computer independent of the application, where the preset is selected according to the connected speaker.

In the specification and claims, a composite equalization curve may be any curve that represents equalization, which may be in such forms as a Gaussian shaped curve, a low shelf curve, a low pass curve, a high shelf curve, a high pass curve, a notch, a phase shift, or other types of equalization curves, in addition to the sum of a plurality of such curves.

In the specification and claims, speakers include speakers placed in headphones.

While this invention has been described in terms of several preferred embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, permutations, and substitute equivalents as fall within the true spirit and scope of the present invention.

What is claimed is:

1. A computer readable medium containing program instructions for controlling a parametric equalizer, comprising:

computer readable code for displaying a composite equalization curve, a first frequency curve with a first center frequency, a second frequency curve with a second center frequency, and a third frequency curve with a third center frequency, wherein the composite equalization curve is formed from at least the first frequency curve, the second frequency curve, and the third frequency curve;

computer readable code for allowing a dragging movement of the first center frequency, the second center frequency, and the third center frequency;

computer readable code for providing real time changes in equalization according to changes in the equalization curve caused by dragging movement;

computer readable code for displaying a plurality of presets, wherein each preset is displayed as a thumbnail composite curve that graphically indicates the equalization provided by the preset; and an output amplifier electrically connected to the parametric equalizer, wherein the equalization curve represents an equalization curve of the output amplifier.

2. The computer readable medium, as recited in claim 1, further comprising computer readable code for simultaneously displaying equalization curves for a plurality of presets.

3. The computer readable medium, as recited in claim 2, wherein the first frequency curve has a first bandwidth and the second frequency curve has a second bandwidth and wherein the computer readable code for allowing a dragging movement, further comprises computer readable code for allowing a dragging movement of the first bandwidth and the second bandwidth.

4. The computer readable medium, as recited in claim 3, further comprising computer readable code for providing a pull down menu for selecting a parametric filter type.

5. The computer readable medium, as recited in claim 1, further comprising computer readable code for simultaneously displaying a first filter curve, a second filter curve, and a third filter curve with the composite equalization curve, wherein the composite equalization curve is a sum of the first filter curve, the second filter curve, and the third filter curve.

6. The computer readable medium, as recited in claim 5, wherein the first filter curve, the second filter curve, and the third filter curve are Gaussian equalization curves.

7. A computer readable medium containing program instructions for controlling a parametric equalizer, comprising:

computer readable code for displaying a composite equalization curve, a first frequency curve with a first center frequency, a second frequency curve with a second center frequency, and a third frequency curve with a third center frequency, wherein the composite equalization curve is formed from at least the first frequency curve, the second frequency curve, and the third frequency curve;

computer readable code for allowing a dragging movement of the first center frequency, the second center frequency, and the third center frequency;

computer readable code for providing real time changes in equalization according to changes in the equalization curve caused by dragging movement, wherein the dragging movement of the first center frequency is accomplished by dragging a first center frequency object in a first direction; and computer readable code for allowing a dragging movement of a first gain, wherein the dragging movement of the first gain is accomplished by dragging the first center frequency object in a second direction perpendicular to the first directon; and computer readable code for displaying a plurality of presets, wherein each preset is displayed as a thumbnail composite curve that graphically indicates the equalization provided by the preset.

8. The computer readable medium, as recited in claim 7, further comprising computer readable code for simultaneously displaying a first filter curve, a second filter curve, and a third filter curve with the composite equalization curve, wherein the composite equalization curve is a sum of the first filter curve, the second filter curve, and the third filter curve.

9. The computer readable medium, as recited in claim 8, wherein the first filter curve, the second filter curve, and the third, filter curve are Gaussian equalization curves.

10. A computer readable medium containing program instructions for controlling a parametric equalizer, comprising:

computer readable code for displaying a composite equalization curve, a first frequency curve with a first center frequency, a second frequency curve with a second center frequency, and a third frequency curve with a third center frequency, wherein the composite equalization curve is formed from at least the first frequency curve, the second frequency curve, and the third frequency curve;

computer readable code for allowing a dragging movement of the first center frequency, the second center frequency, and the third center frequency;

computer readable code for providing real time changes in equalization according to changes in the equalization curve caused by dragging movement, wherein the dragging movement of the first center frequency is accomplished by dragging a first center frequency object in a first direction;

computer readable code that allows a user to designate the first frequency curve as one of an equalization curve, a low pass filter, a high pass filter, a notch filter, a low shelf filter, and a high shelf filter and computer readable code for displaying a plurality of presets, wherein each preset is displayed as a thumbnail composite curve that graphically indicates the equalization provided by the preset.

11. The computer readable medium, as recited in claim 10, further comprising computer readable code for simultaneously displaying a first filter curve, a second filter curve, and a third filter curve with the composite equalization curve, wherein the composite equalization curve is a sum of the first filter curve, the second filter curve, and the third filter curve.

12. A computer readable medium containing program instructions for controlling a parametric equalizer, comprising:

computer readable code for displaying a composite equalization curve, a first frequency curve with a first center frequency, a second frequency curve with a second center frequency, and a third frequency curve with a third center frequency, wherein the composite equalization curve is formed from at least the first frequency curve, the second frequency curve, and the third frequency curve;

computer readable code for allowing a dragging movement of the first center frequency, the second center frequency, and the third center frequency;

computer readable code for providing real time changes in equalization according to changes in the equalization curve caused by dragging movement;

computer readable code for saving equalization parameters as a preset;

computer readable code for displaying a plurality of presets, wherein each preset is displayed as a thumbnail composite curve that graphically indicates the equalization provided by the preset;

computer readable code for identifying a preset with a speaker type; and computer readable code for loading a preset according to speaker type.

13. The computer readable medium, as recited in claim 12, further comprising computer readable code for simultaneously displaying a first filter curve, a second filter curve, and a third filter curve with the composite equalization curve, wherein the composite equalization curve is a sum of the first filter curve, the second filter curve, and the third filter curve.

14. A computer readable medium containing program instructions for controlling a parametric equalizer, comprising:

computer readable code for simultaneously displaying a composite equalization curve, a first filter curve with a first center frequency, a second filter curve with a second center frequency, and a third filter curve with a third center frequency, wherein the composite equalization curve is a sum of the first filter curve, the second filter curve, and the third filter curve; and computer readable code for allowing a dragging movement of the first center frequency, the second center frequency, and the third center frequency; and computer readable code for displaying a plurality of presets, wherein each preset is displayed as a thumbnail composite curve that graphically indicates the equalization provided by the preset.

15. The computer readable medium, as recited in claim 14, further comprising computer readable code for simultaneously displaying equalization curves for a plurality of presets.

16. The computer readable medium, as recited in claim 14, wherein the first filter curve has a first bandwidth and the second filter curve has a second bandwidth and wherein the computer readable code for allowing a dragging movement, further comprises computer readable code for allowing a dragging movement of the first bandwidth and the second bandwidth.

17. The computer readable medium, as recited in claim 14, wherein the first filter curve, the second filter curve, and the third filter curve are Gaussian equalization curves.

\* \* \* \* \*